United States Patent
Tao et al.

(10) Patent No.: US 11,367,806 B2
(45) Date of Patent: Jun. 21, 2022

(54) PHOTOVOLTAIC STRINGER AND METHOD FOR MANUFACTURING PHOTOVOLTAIC RIBBON

(71) Applicants: ZHEJIANG JINKO SOLAR CO., LTD., Zhejiang (CN); JINKO SOLAR CO., LTD., Jiangxi (CN)

(72) Inventors: Wusong Tao, Zhejiang (CN); Zhiqiu Guo, Zhejiang (CN); Peidong Qi, Zhejiang (CN); Tingting Li, Zhejiang (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/227,274

(22) Filed: Apr. 10, 2021

(65) Prior Publication Data
US 2021/0320220 A1   Oct. 14, 2021

(30) Foreign Application Priority Data

Apr. 13, 2020   (CN) .......................... 202010289245.6

(51) Int. Cl.
*H01L 31/18* (2006.01)
*H01L 21/48* (2006.01)

(52) U.S. Cl.
CPC ........ *H01L 31/188* (2013.01); *H01L 21/4896* (2013.01)

(58) Field of Classification Search
CPC ......... C21D 9/62; F27D 11/04; H05B 3/0009; H01L 31/188; H01L 21/4896
See application file for complete search history.

(56) References Cited

U.S. PATENT DOCUMENTS

| 2006/0219352 A1* | 10/2006 | Micciche | H01L 31/188 |
| | | | 156/250 |
| 2009/0236328 A1* | 9/2009 | Dingle | B23K 3/085 |
| | | | 219/616 |

(Continued)

FOREIGN PATENT DOCUMENTS

| CN | 202989244 U | 6/2013 |
| CN | 203782195 U | 8/2014 |

(Continued)

OTHER PUBLICATIONS

Zhejiang Jinko Solar Co., Ltd et al., Extended European Search Report, EP 21167692.9, dated Aug. 26, 2021, 6 pgs.

(Continued)

*Primary Examiner* — Sadie White
(74) *Attorney, Agent, or Firm* — USCH Law, PC

(57) ABSTRACT

The present disclosure provides a photovoltaic stringer and a method for manufacturing a photovoltaic ribbon. The photovoltaic stringer includes a first clamping component to pull a ribbon from a ribbon reel, a second clamping component to coordinate with the first clamping component to stretch the ribbon, a cutting component to cut the ribbon, and, at least one first electrode and at least one second electrode to supply power to the ribbon. The method for manufacturing a photovoltaic ribbon comprises acquiring a ribbon reel and pulling a ribbon, stretching the ribbon and cutting the ribbon to obtain a cut ribbon, and performing an annealing process on the cut ribbon.

16 Claims, 4 Drawing Sheets

(56) References Cited

U.S. PATENT DOCUMENTS

| | | | | |
|---|---|---|---|---|
| 2010/0037932 A1* | 2/2010 | Erez | ................ | H01L 31/188 |
| | | | | 136/244 |
| 2012/0228362 A1* | 9/2012 | Schultis | ................ | B65H 69/08 |
| | | | | 228/102 |
| 2012/0247554 A1* | 10/2012 | Wootton | ............. | H01L 31/0508 |
| | | | | 136/256 |
| 2013/0164863 A1* | 6/2013 | Miyake | ................ | B21F 1/02 |
| | | | | 438/6 |
| 2013/0277361 A1* | 10/2013 | Tan | ................ | B23K 1/0016 |
| | | | | 219/616 |
| 2014/0224387 A1* | 8/2014 | Seto | ................ | C21D 1/40 |
| | | | | 148/568 |
| 2016/0273068 A1* | 9/2016 | Affaticati | ................ | C21D 9/563 |

FOREIGN PATENT DOCUMENTS

| | | |
|---|---|---|
| CN | 205452297 U | 8/2016 |
| CN | 107186392 A | 9/2017 |
| CN | 109609735 A | 4/2019 |
| CN | 110137290 A | 8/2019 |
| EP | 2822044 A1 | 1/2015 |
| JP | 4986462 B2 | 7/2012 |
| JP | 2019114767 A | 7/2019 |
| WO | 2015071992 A1 | 5/2015 |

OTHER PUBLICATIONS

Zhejiang Jinko Solar Co., Ltd et al., JP First Office Action, JP 2021-067047, dated Jul. 7, 2021, 2 pgs.

* cited by examiner

PHOTOVOLTAIC STRINGER AND METHOD FOR MANUFACTURING PHOTOVOLTAIC RIBBON

TECHNICAL FIELD

The present disclosure relates to the field of photovoltaic ribbon technology, in particular, to a photovoltaic stringer, and a method for manufacturing a photovoltaic ribbon.

BACKGROUND

Nowadays, dense grid modules (typically 9 grids) have gradually become mainstream photovoltaic module products. Major companies have already launched corresponding dense grid products, and many photovoltaic module manufacturers have the ability of mass production. Generally, the dense grid modules use round wire ribbons as interconnection strips. In an automatic soldering process, a stringer performs some steps such as pulling a ribbon—clamping the ribbon—stretching the ribbon—cutting the ribbon—moving the ribbon. During the process, the ribbon is stretched so as to make the ribbon drawn from a reel change from a bent state to a state with a certain straightness, which facilitates a subsequent soldering process.

SUMMARY

Some embodiments of the present disclosure provide a photovoltaic stringer, and a method for manufacturing a photovoltaic ribbon, so as to improve connection reliability of the photovoltaic ribbon to cells in a photovoltaic module.

In an embodiment, a photovoltaic stringer includes: a first clamping component to pull a ribbon from a ribbon reel; a second clamping component to coordinate with the first clamping component to stretch the ribbon; a cutting component to cut the ribbon to obtain a cut ribbon; and at least one first electrode and at least one second electrode to supply power to the cut ribbon.

In an embodiment, the photovoltaic stringer further includes a holding component to install the cutting component and fixing an end of the ribbon; the at least one second electrode is installed on the holding component, and the at least one first electrode is installed on the first clamping component.

In an embodiment, there are a plurality of first electrodes and a plurality of second electrodes, the plurality of first electrodes are disposed on the first clamping component successively in a direction perpendicular to a pulling direction of the ribbon; the plurality of second electrodes are disposed on the holding component successively in the direction perpendicular to the pulling direction of the ribbon.

In an embodiment, the first clamping component includes a first upper clamping section to hold downward the ribbon from above the ribbon and a first lower clamping section located below the first upper clamping section, the plurality of first electrodes respectively being disposed on the first upper clamping section; and the holding component includes a second upper clamping section to hold downward the ribbon from above the ribbon and a second lower clamping section located below the second upper clamping section, the plurality of second electrodes respectively being disposed on the second upper clamping section.

In an embodiment, the first lower clamping section is disposed with a plurality of first auxiliary electrodes in a one-to-one correspondence to the plurality of first electrodes, the second lower clamping section is disposed with a plurality of second auxiliary electrodes in a one-to-one correspondence to the plurality of second electrodes; the first lower clamping section and the second lower clamping section are both made of a conductive material.

In an embodiment, the photovoltaic stringer further includes a monitoring component to acquire a real-time parameter of the ribbon, and a controller to control a magnitude of an annealing electrical current input to the ribbon according to information acquired by the monitoring component; the at least one first electrode, the at least one second electrode, the controller and the monitoring component are connected in an annealing circuit.

In an embodiment, the photovoltaic stringer further includes a transformer to adjust voltage and a rectifier to convert an alternating current to a direct current, the transformer being electrically connected to the ribbon and the controller.

In an embodiment, the first clamping component is a clamping cylinder, and the second clamping component is a clamp.

A method for manufacturing a photovoltaic ribbon, including: step S1: acquiring a ribbon reel and pulling a ribbon; step S2: stretching the ribbon and cutting the ribbon to obtain a cut ribbon; step S3: performing an annealing process on the cut ribbon.

In an embodiment, after the step S3, the method further includes: step S4: moving the ribbon after the annealing process, for soldering a cell of a photovoltaic module.

In an embodiment, the step S3 includes supplying an annealing current to the ribbon, and the supplying an annealing current to the ribbon includes a step of providing a direct current to the ribbon with a stringer. Alternately, the supplying an annealing current to the ribbon includes steps of: converting the annealing current from an alternating current to a direct current by a rectifier; and supplying the direct current to the ribbon.

In an embodiment, the direct current is greater than or equal to 10 A.

In an embodiment, a cross section of the ribbon pulled is circular with a diameter of 0.3 mm to 0.4 mm, and a length of a cut ribbon is 50 mm to 220 mm.

In an embodiment, the step S3 includes: fixing two ends of the cut ribbon; connecting the two ends of the ribbon in an annealing circuit; powering off after a preset electrified time; and cooling the ribbon.

In an embodiment, the step S3 further includes:
acquiring a real-time current and/or a real-time voltage, a real-time temperature and an electrified time after powering on; and
adjusting magnitude of the annealing electrical current according to the real-time current and/or the real-time voltage, the real-time temperature and the electrified time.

In an embodiment, step S3 further includes:
reducing the annealing current when a real-time current is greater than a preset current threshold;
reducing the annealing current when a real-time voltage is greater than a preset voltage threshold; and
reducing the annealing current when a real-time temperature is greater than a preset temperature threshold.

The photovoltaic stringer in the present disclosure includes: a first clamping component to pull a ribbon from a ribbon reel, a second clamping component to coordinate with the first clamping component to stretch the ribbon, a cutting component to cut the ribbon, and at least one first electrode and at least one second electrode to supply power to the ribbon. The at least one first electrode and the at least one second electrode are added to the photovoltaic stringer, and then the cut ribbon is electrical current-annealed, i.e., an electrical current-annealing process is performed on the cut ribbon before soldering a cell, the process costs short time and is efficient. The process is also convenient by adding a power-on step before moving the ribbon without causing any extra cost of time and labor.

The method for manufacturing a photovoltaic ribbon includes the following steps: step S1: acquiring a ribbon reel and pulling a ribbon; step S2: stretching the ribbon and cutting the ribbon to obtain a cut ribbon; step S3: performing an annealing process on the cut ribbon. In this method, an annealing process is performed on the ribbon after the ribbon is pulled, stretched and cut. In this method, annealing process parameters on the ribbon 3 may be set more accurately, which may consider more sufficiently an effect of a stretch on the yield strength of the ribbon 3, and may further increase effectiveness of the annealing process, thereby increasing connection firmness between the ribbon 3 and the cell 12, and reducing the defect rate.

BRIEF DESCRIPTION OF THE DRAWINGS

In order to explain the embodiments of the present disclosure or the technical solutions in the existing technology more clearly, the drawings to be used in the description of the embodiments or the existing technology will be briefly described. Obviously, the drawings in the following description are only some embodiments of the present disclosure. For those of ordinary skill in the art, other drawings may be obtained based on these drawings without any creative effort.

LIST OF REFERENCE NUMERALS

Figure 1:
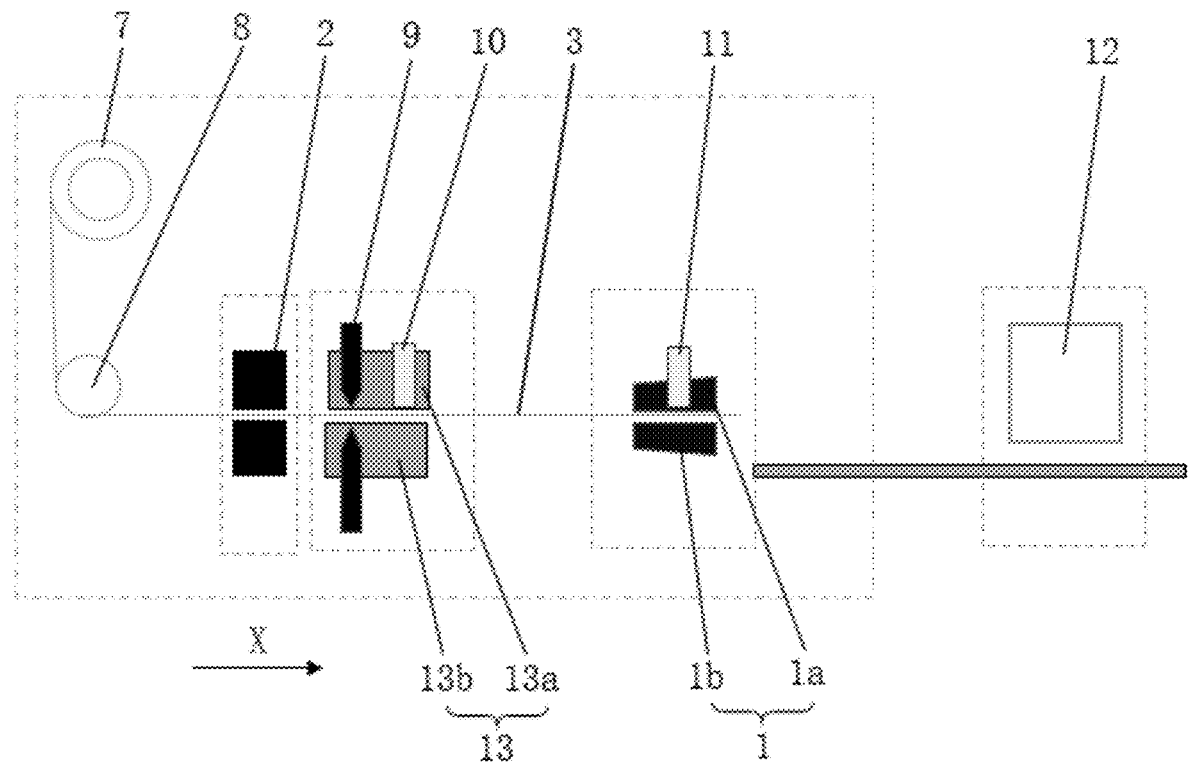
FIG. 1 is a structural schematic diagram of a photovoltaic stringer in the present disclosure.

1 first clamping component
1*a* first upper clamping section
1*b* first lower clamping section
2 second clamping component
3 ribbon
4 transformer
5 controller
6 monitoring component
7 ribbon reel
8 guide wheel
9 cutting component
10 second electrode
10*a* second auxiliary electrode
11 first electrode
11*a* first auxiliary electrode
12 cell
13 holding component
13*a* second upper clamping section
13*b* second lower clamping section

DETAILED DESCRIPTION

The objective of the present disclosure is to provide a photovoltaic stringer, and a method for manufacturing a photovoltaic ribbon to improve connection reliability of the photovoltaic ribbon to cells in a photovoltaic module.

In order to make the solutions of the present disclosure better understood by those of ordinary skill in the art, the present disclosure will be further described in details with reference to the drawings and the specific embodiments.

Figure 2:
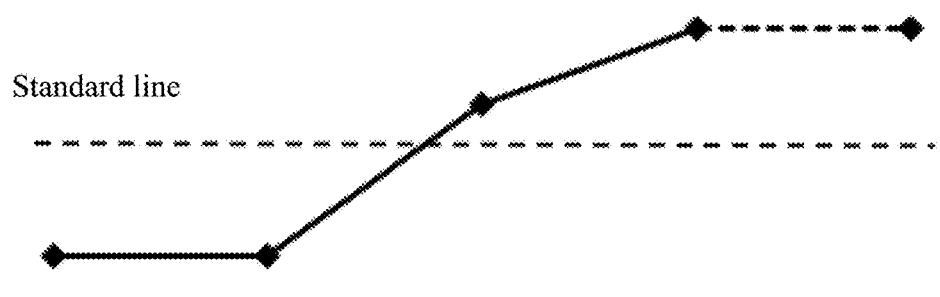
FIG. 2 is a schematic diagram of a yield strength change of a ribbon in each step in an existing technology.
Figure 3:
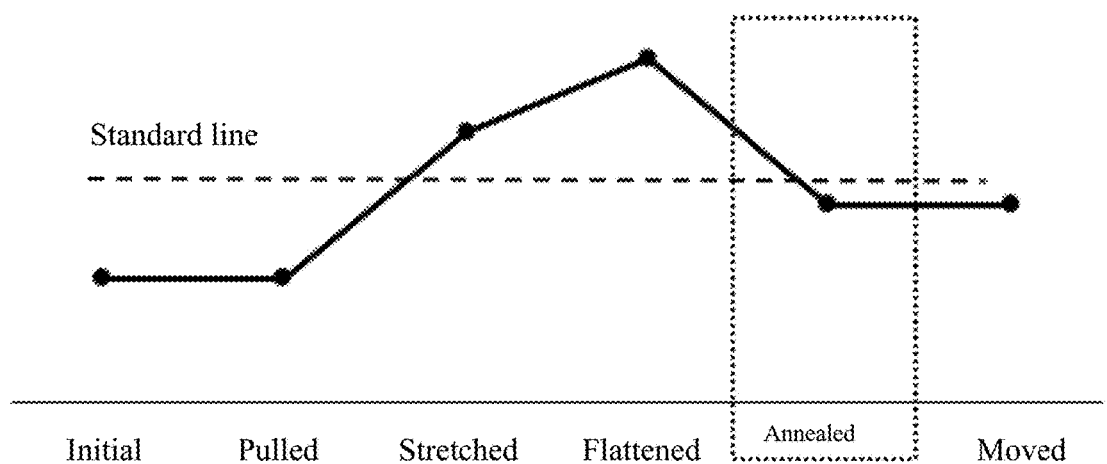
FIG. 3 is a schematic diagram of a yield strength change of a ribbon in each step in an embodiment of the present disclosure.
Figure 4:
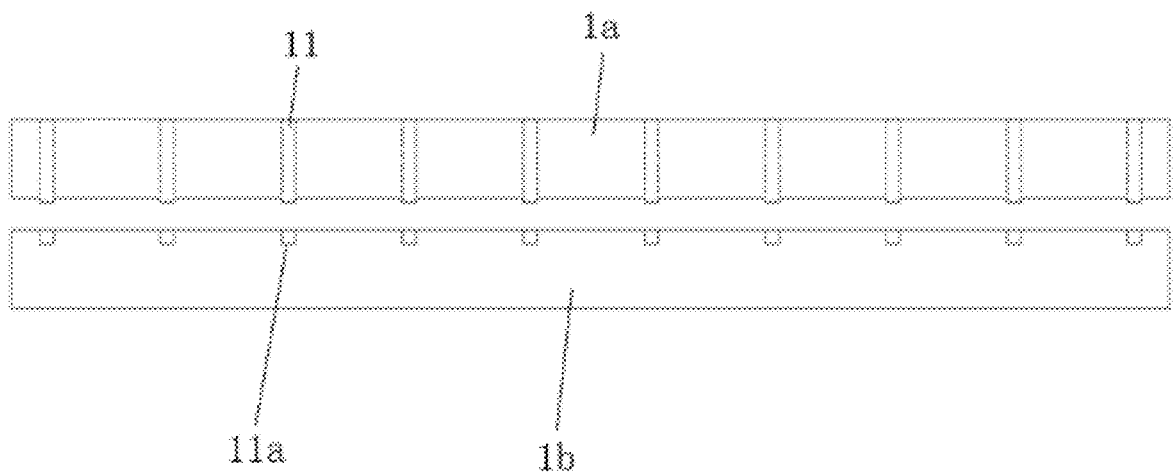
FIG. 4 is a schematic diagram of a front view of a first clamping component in FIG. 1.
Figure 5:
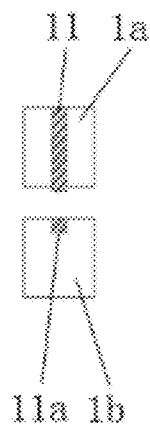
FIG. 5 is a schematic diagram of a side view of the first clamping component in FIG. 1.
Figure 6:
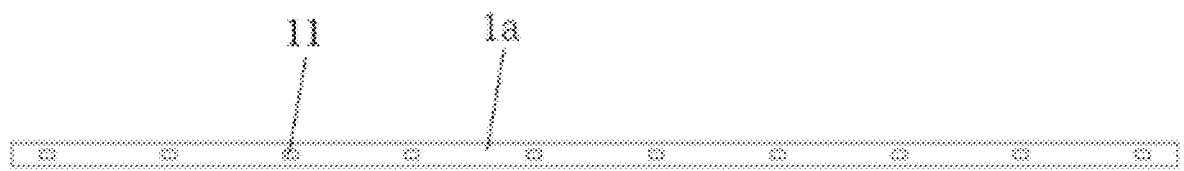
FIG. 6 is a schematic diagram of a top view of the first clamping component in FIG. 1.
Figure 7:
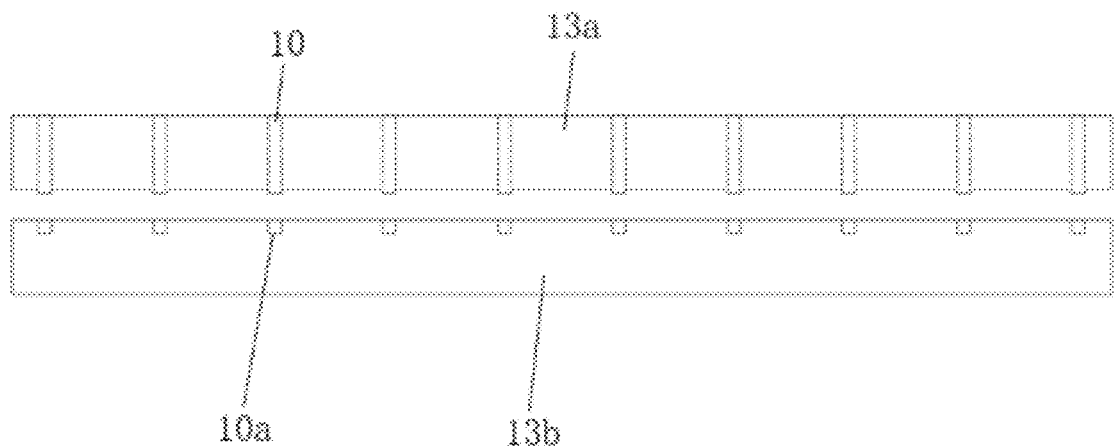
FIG. 7 is a schematic diagram of a front view of a holding component in FIG. 1.
Figure 8:
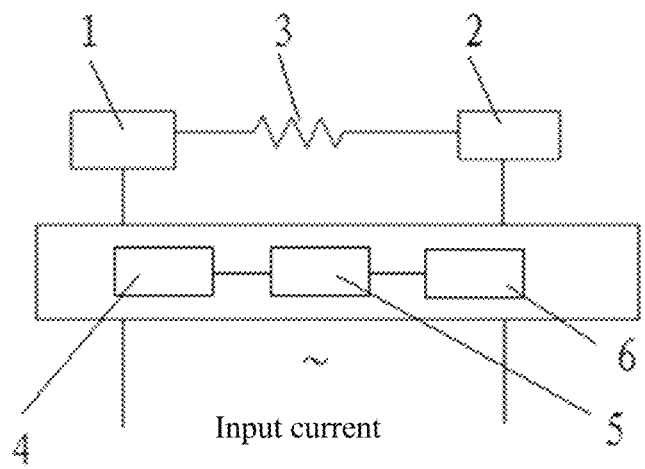
FIG. 8 is a structural schematic diagram of an annealing circuit of the photovoltaic stringer in the present disclosure.
Figure 9:
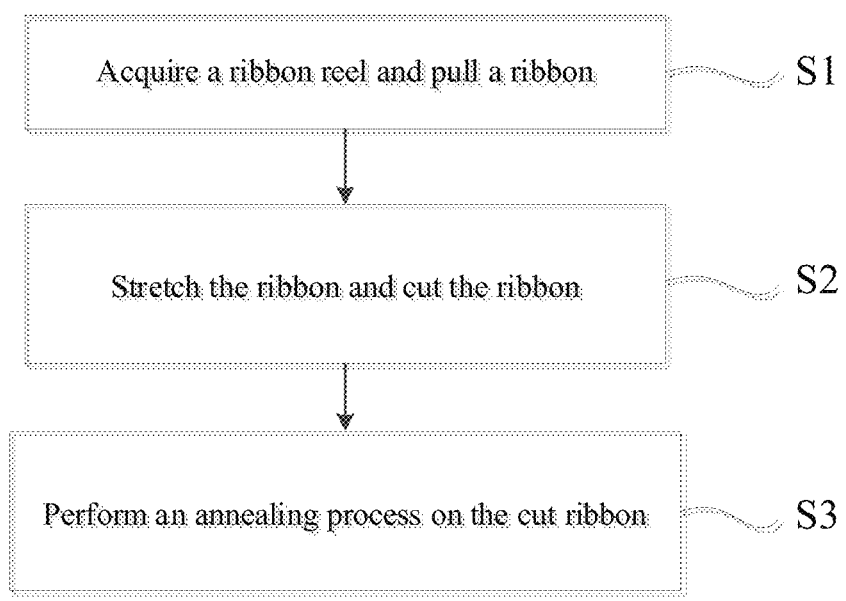
FIG. 9 is a flow chart of a method for manufacturing the photovoltaic ribbon in the present disclosure.

With reference to FIGS. 1 to 9, FIG. 1 is a structural schematic diagram of a photovoltaic stringer in the present disclosure; FIG. 2 is a schematic diagram of a yield strength change of a ribbon in each step in the existing technology; FIG. 3 is a schematic diagram of a yield strength change of a ribbon in each step in an embodiment of the present disclosure; FIG. 4 is a schematic diagram of a front view of a first clamping component of photovoltaic stringer in the present disclosure; FIG. 5 is a schematic diagram of a side view of the first clamping component in the present disclosure; FIG. 6 is a schematic diagram of a top view of the first clamping component in the present disclosure; FIG. 7 is a schematic diagram of a front view of a holding component of photovoltaic stringer in the present disclosure; FIG. 8 is a structural schematic diagram of an annealing circuit of the photovoltaic stringer in the present disclosure; and FIG. 9 is a flow chart of a method for manufacturing the photovoltaic ribbon in the present disclosure.

The inventors find that, a conventional stretching process of the ribbon may increase yield strength of a copper material of the ribbon. The yield strength of a finished round wire ribbon is about 60-70 Mpa. After the ribbon is stretched, the yield strength may reach more than 100 Mpa, which is far greater than a standard upper limit of 90 Mpa. In the existing technology, in order to reduce the yield strength of the ribbon, one way is performed during processing a copper wire, and a large electrical current is supplied when the copper wire is passing through a structure (e.g., an annealing wheel) to complete an annealing process. The process is performed when the copper wire is as raw material. Another way is performed during processing a ribbon, a tin-coated copper ribbon is energized when passing through an energized wheel, so as to complete the annealing process.

However, the methods used in the existing technologies can only be processed either during processing the copper wire or after the ribbon is coated with a tin layer, but has a poor accuracy of controlling the yield strength after the ribbon is pulled to be stretched.

Therefore, it is desired to effectively improve connection reliability of the photovoltaic ribbon to cells in a photovoltaic module and to improve a product yield.

In view of the above, in an embodiment of the present disclosure, the photovoltaic stringer includes a first clamping component 1, a second clamping component 2, a cutting component 9, at least one first electrode 11 and at least one second electrode 10.

Herein, the first clamping component 1 is configured to pull a ribbon 3 from a ribbon reel 7, the second clamping component 2 is configured to coordinate with the first clamping component 1 to stretch the ribbon 3, the cutting component 9 is configured to cut the ribbon 3, the at least one first electrode 11 and the at least one second electrode 10 are configured to supply power to the ribbon 3 to complete a power-on loop to realize heating of the ribbon 3, and further to complete an annealing process of the ribbon 3.

In the embodiment, the at least one first electrode 11 and the at least one second electrode 10 are added to the photovoltaic stringer, to perform an electrical current-annealing on the cut ribbon 3, i.e., perform an annealing process on the cut ribbon 3 before soldering a cell 12, the electrical current-annealing costs short time and is efficient. It is also convenient to add a power-on step before moving the ribbon 3, which causes no extra cost of time and labor.

Further, the photovoltaic stringer includes a holding component 13 to install the cutting component 9 and fixing an end of the ribbon 3. Before the cutting component 9 cuts the ribbon 3, another end of the ribbon 3 is pulled by the first clamping component 1. When the ribbon 3 needs to be stretched, the second clamping component 2 works and the ribbon 3 is stretched between the first clamping component 1 and the second clamping component 2. After stretching is completed, the cutting component 9 cuts the ribbon 3. Afterward, one end of the cut ribbon 3 is fixed by the holding component 13, while the other end of the cut ribbon 3 remains to be clamped by the first clamping component 1.

Further, the at least one second electrode 10 is installed on the holding component 13, and the at least one first electrode 11 is installed on the first clamping component 1. The at least one first electrode 11 and the at least one second electrode 10 are respectively located near two ends of the cut ribbon 3.

Here, it shall be noted that the at least one first electrode 11 and the at least one second electrode 10 are configured to directly contact the ribbon 3 to perform electrical current transmission. The at least one first electrode 11 and the at least one second electrode 10 may be made of copper or other conductive materials. The shape of the at least one first electrode 11 and of the at least one second electrode 10 may be a cylinder, a block or the like and is not specifically defined. In an embodiment, both the first electrode 11 and the second electrode 10 are rod-shaped electrodes.

After the ribbon 3 is produced as a product (typically packaged with a reel around which the ribbon 3 winds), the ribbon has an initial yield strength. Ribbons 3 of different standards require different yield strengths. Take a tin-coated copper ribbon 3 with a diameter of 0.35 mm as an example, its initial yield strength is generally 60 to 70 Mpa, and a test standard is generally smaller than or equal to 90 Mpa. During manufacturing, the ribbon 3 needs to be pull down from the reel, straightened and perform soldering, i.e., including the following steps: pulling the ribbon, stretching the ribbon, flattening the ribbon (dispensable), moving the ribbon, and welding the ribbon. In the entire procedure, a change in yield strength of the ribbon 3 is shown in FIG. 2. The tin-coated copper ribbon 3 with the diameter of 0.35 mm is further taken as an example. After the ribbon is stretched, the yield strength of the ribbon 3 is obviously raised beyond a standard value. After the ribbon is flattened, however, the yield strength of the ribbon 3 will be further increased. After the ribbon is stretched, its yield strength is increased from around 65 Mpa to around 97 Mpa (while the standard value is smaller than or equal to 90 Mpa), and after the ribbon is flattened, the yield strength is increased to around 110 Mpa which greatly exceeds the standard. In order to make the yield strength of the ribbon 3 before soldering meet the standard, the annealing process needs to be performed on a stretched or flattened ribbon 3. As shown in FIG. 3, after the annealing process is performed on the ribbon 3, the yield strength of the ribbon recovers to within the standard value range (which may be 80 to 85 Mpa). In addition, the annealing process has to be performed after the ribbon is flattened. Otherwise, if the flattening is performed after the annealing process, the yield strength of the ribbon 3 would again be increased to around 95 Mpa which exceeds the standard and the annealing process would be meaningless.

In an embodiment, as shown in FIGS. 4 to 7, there are a plurality of first electrodes 11 and a plurality of second electrodes 10. The plurality of first electrodes 11 are disposed on the first clamping component 1 successively in a direction perpendicular to a pulling direction X (as shown in FIG. 1) of the ribbon 3, and the plurality of second electrodes 10 are disposed on the holding component 13 successively in the direction perpendicular to the pulling direction X of the ribbon 3. Accordingly, a plurality of ribbons may simultaneously pass through the holding component 13 and may be simultaneously cut by using the cutting component 9 installed on the holding component 13. After the plurality of first electrodes 11 and the plurality of second electrodes 10 are powered on, the electrical current may pass through the plurality of ribbons 3 located between the first electrodes 11 and the second electrodes 10, so as to simultaneously perform the annealing process on the plurality of cut ribbons 3.

In this embodiment, the photovoltaic stringer is adaptive for a large electrical current-annealing process on the ribbons 3. The reason for why the large electrical current-annealing process is selected is mainly because a conventional constant-temperature annealing manner (to keep a temperature for some time to allow inner crystalline grains within a copper material to experience three phases of grain recovery, recrystallization and growth, so as to remove an effect of an inner residual stress of the copper material on the copper material, thereby realizing the purpose of annealing) has the following restricted conditions:

1. Time constraint. The annealing of the copper material requires a long time, which may generally be one hour during a standard annealing process. In an actual manufacturing process, a ribbon is pulled for use as being needed, so there is no time for annealing.

2. Restriction of a material of the ribbon per se. The annealing of the copper material generally requires a temperature of 500° C. However, the ribbon 3 is a copper substrate with its surface coated with a solder layer, and the solder layer generally is a tin lead alloy having a melting point of 178° C. Therefore, under the annealing temperature of 500° C., the solder layer would completely come off, and the ribbon 3 without the solder layer can not be used for soldering and thus loses a fundamental function as a ribbon 3. In addition, protection gas is also needed for protection to prevent the copper from being oxygenized, which causes a high operation difficulty.

However, the above problem may be solved by the large electrical-current annealing manner in the present disclosure.

In an embodiment, a pressing-down direct-contacting electrode is applied, in order to prevent straightness of the ribbon 3 from being affected during the annealing process. In an embodiment, the first clamping component 1 includes a first upper clamping section 1a to hold down the ribbon 3 from above the ribbon 3, and a first lower clamping section 1b located below the first upper clamping section 1a, the first electrode(s) 11 respectively disposed on the first upper clamping section 1a. The holding component 13 includes a second upper clamping section 13a to hold down the ribbon 3 from above the ribbon 3, and a second lower clamping section 13b located below the second upper clamping section 13a, the second electrode(s) 10 respectively disposed on the second upper clamping section 13a. The first lower clamping section 1b and the second lower clamping section 13b has functions of holding the ribbon 3 and respectively supporting the pressing-down first electrodes 11 and the pressing-down second electrodes 10. The first upper clamping section 1a and the second upper clamping section 13a have a function of respectively fixing the first electrode(s) 11 and second electrode(s) 10 located thereon, and perform a pressing-down action. The pressing-down direct-contacting electrodes are disposed behind the cutting component 9, that is, the ribbon 3 passes the cutting component prior to the pressing-down direct-contacting electrodes during pulling. Before the cutting component 9 works, the second upper clamping section 13a presses down to fix the ribbon 3. After a cutting process is performed by the cutting component 9, the first electrode(s) 11 and the second electrode(s) 10 are powered on, to complete the annealing process. Herein, since the ribbon 3 is supplied power after being cut, an accident due to current leakage is prevented. Further, since the pressing-down direct-contacting electrodes are adopted, the straightness of the ribbon 3 is ensured after the ribbon is cut. However, in a case where a roll electrode is applied, the ribbon 3 may be bended and rolled when the roll electrode contacts the ribbon 3. In this embodiment, the using of pressing-down direct-contacting electrodes ensures that the ribbon 3 is not bent, which may facilitate a subsequent production and soldering process. Besides, the pressing-down direct-contacting electrodes may ensure that the first electrode(s) 11, the second electrode(s) 10 sufficiently contact the ribbon 3 to supply power while not affecting the straightness of the ribbon 3.

In an embodiment, a plurality of first auxiliary electrodes 11a in a one-to-one correspondence to the plurality of first electrodes 11 are disposed on the first lower clamping section 1b, a plurality of second auxiliary electrodes 10a in a one-to-one correspondence to the plurality of second electrodes 10 are disposed on the second lower clamping section 13b. The first lower clamping section 1b and the second lower clamping section 13b are both made of a conductive material. Herein, the plurality of first auxiliary electrodes 11a may increase contact area between the ribbon 3 and the electrodes (i.e., the first electrodes and the first auxiliary electrodes) when the first clamping component 1 clamps the ribbon 3, the plurality of second auxiliary electrodes 10a may increase contact area between the ribbon 3 and the electrodes (i.e., the second electrodes and the second auxiliary electrodes) when the holding component 13 clamps the ribbon 3. Therefore, an electrified effect of the first electrodes 11 and the second electrodes 10 is improved by respectively setting auxiliary electrodes on the first clamping component 1 and the holding component 13.

Experiments prove that under an electrical current of 80 A (ampere), a time for completing annealing of a copper substrate with a cross section of 0.25 mm×1.50 mm and a length of 1 m is 0.0125 s (second), and the yield strength of the ribbon 3 can be reduced from about 100 Mpa to 56 Mpa. Thus, an annealing time can be effectively reduced when the large electrical current method is used for annealing the ribbon 3. The annealing time is very short and does not affect such the subsequent process as soldering of the ribbon 3. In addition, the ribbon 3 per se is a conductive material, and the annealing process can be realized by supplying a large electrical current through both ends of the ribbon 3, which is easy to achieve.

In an embodiment, the photovoltaic ribbon 3 used may be a round filament ribbon, which has a cross-sectional diameter of about 0.35 mm (approximately between 0.3 mm and 0.4 mm) and a length of 50 mm to 220 mm after being stretched. A required current can be limited to about 10 A, and safety risks can also be reasonably controlled. It shall be noted that since the photovoltaic ribbon 3 is a conductive material, a cross-sectional shape and size (cross-sectional diameter/cross-sectional area, length) of the photovoltaic ribbon 3 have little effect on its own resistance. Therefore, ribbons of different cross-sectional shapes and sizes (cross-sectional diameter/cross-sectional area, length) used in photovoltaic products of different sizes may generate sufficient heat for annealing at a current of 10 A. Alternatively, in a case of continuous technological development or special requirements for a size of a ribbon, the current may also be appropriately increased, which will not be detailed here.

It shall be noted that the above-mentioned photovoltaic stringer may further includes soldering components (not shown in the drawings) for soldering cells. The cells are placed at the soldering components first. After the ribbon 3 is cut and annealed, the ribbon 3 may be moved to a certain position by the first clamping component 1 to perform soldering of the ribbon 3 and cells. In this way, after the annealing process is completed, the soldering process may be performed immediately for the ribbon 3 and the cells, thereby ensuring that the yield strength of the ribbon 3 before soldering meets a standard requirement.

The annealing process of the above-mentioned photovoltaic stringer is as follows.

Firstly, the first upper clamping section 1a presses down and clamps the first lower clamping section 1b to fix the ribbon 3, while the holding component 13 is kept released, so that the cutting component 9 and the second electrode(s) 10 disposed on the fixing component 13 are in a raised state. The first clamping component 1 pulls the ribbon 3 to move right (along a pulling direction X shown in FIG. 1), and stops pulling when the ribbon 3 is pulled to a certain length.

Secondly, the second clamping component 2 clamps to compress the ribbon 3. The first clamping component 1 further moves to the right for a certain distance to stretch the ribbon 3 and then stops moving. Here, a moving distance of the first clamping component 1 depends on a stretching ratio required by the ribbon 3.

Thirdly, the ribbon 3 is flattened at a specific position (this step is dispensable).

Fourthly, the second upper clamping section 13a presses downward the second lower clamping section 13b and fixes the ribbon 3. The cutting component 9 cuts the ribbon 3.

Fifthly, the first electrode(s) 11 and the second electrode(s) 10 are powered on with an electrified time of T (a time length of T may be adjusted according to an actual condition), and then the first electrode(s) 11 and the second electrode(s) 10 are stopped from being powered.

Sixthly, the second upper clamping section 13a rises away from the ribbon 3 to release the ribbon 3, the first clamping component 1 moves right to carry the ribbon 3 to a specific position.

Seventhly, the first clamping component 1 moves left to a candidate ribbon 3 to clamp a new ribbon 3, and repeats the above steps.

In an embodiment, the photovoltaic stringer may further include a guide wheel 8, and the guide wheel 8 may change an extension direction of the ribbon 3 to facilitate following stretching and cutting operations.

In an embodiment, the photovoltaic stringer may further include a controller 5 and a monitoring component 6. Herein, the ribbon 3 is taken as a load in the annealing circuit, and the ribbon 3 is electrified to generate heat for annealing. The monitoring component 6 is configured to obtain a real-time parameter of the ribbon 3. In an embodiment, the monitoring component 6 monitors a real-time electrical current and/or a real-time voltage, a real-time temperature and an electrified time of the ribbon 3 to prevent over-burning due to an excessively high temperature or to prevent insufficient annealing. The controller 5 is configured to control magnitude of an annealing electrical current input to the ribbon 3 according to the acquired information of the monitoring component 6. In an embodiment, the controller 5 controls a magnitude of the annealing electrical current and controls a power off of the annealing electrical current, on basis of the real-time electrical current and/or the real-time voltage, the real-time temperature and the electrified time fed back by the monitoring component 6. The first electrode(s) 11, the second electrode(s) 10, the controller 5 and the monitoring component 6 are all connected in the annealing circuit.

In an embodiment, the photovoltaic stringer may further include a transformer 4 to adjust voltage. The transformer 4 is connected to the ribbon 3, and the transformer 4 is connected to the controller 5.

In an embodiment, the photovoltaic stringer may further include a rectifier to convert an alternating current to a direct current. The rectifier converts the alternating current to the direct current which is more stable and more controllable.

In an embodiment, the annealing circuit may be powered by an external power supply. For example, a power grid may provide alternating current which is converted to direct current by using the rectifier. Alternatively, the circuit is provided with direct current by the stringer. The transformer 4 may increase the voltage to a required fixed value. The monitoring component 6 monitors and feeds back to the controller 5 the real-time current and/or the real-time voltage, the real-time temperature and the electrified time of the ribbon 3. The controller 5 controls the powering off and the current magnitude according to the information fed back, adjusts the input current to a required annealing current and supplies power to the ribbon 3.

In an embodiment, the first clamping component 1 is a clamping cylinder, and the second clamping component 2 is a clamp. In an embodiment, the clamping cylinder is released when the ribbon is pulled. The clamping cylinder clamps the ribbon 3 when the ribbon is stretched, cut, annealed and moved. The clamp may implement stretching and moving of the ribbon 3.

In an embodiment, the present disclosure further provides a method for manufacturing a photovoltaic ribbon.

The method includes the following steps.

In step S1, acquire a ribbon reel 7 and pull a ribbon 3. The step may be performed by the first clamping component 1.

In step S2, stretch the ribbon 3 and cut the ribbon 3. The cutting process may be performed by the cutting component 9;

In step S3, perform an annealing process on the cut ribbon 3. The step may be performed by electrically connecting the first electrode 11 and the second electrode 10.

In an embodiment, after step S3, the method further includes the following step.

In step S4: move the ribbon 3 after the annealing process, for soldering cells 12 of the photovoltaic module.

In an embodiment, the step of providing an annealing electrical current to the ribbon 3 includes: providing a direct current to the ribbon 3 by the stringer. Alternately, the step of providing the annealing current to the ribbon 3 particularly includes: converting the annealing current from an alternating current to a direct current by a rectifier; and providing the direct current to the ribbon 3.

In an embodiment, the step S3 may include:

fixing two ends of the cut ribbon 3; and the fixing process may be implemented by the first clamping component 1 and the second clamping component 2;

connecting the two ends of the ribbon 3 into the annealing circuit;

turning off the power supply after a preset electrified time; and cooling the ribbon 3; and the cooling process may be performed at room temperature.

In an embodiment, the step S3 may further include:

acquiring a real-time current and/or a real-time voltage, a real-time temperature and an electrified time after the power is supplied; and adjusting a magnitude of the annealing current according to the real-time current and/or the real-time voltage, the real-time temperature and the electrified time. In this way, a feedback mechanism is added, which may effectively prevent temperature from being so high as to cause over-burning or prevent insufficient annealing, thereby improving product yield.

In an embodiment—step S3 may further include:

decreasing the annealing electrical current when a real-time current is greater than a preset current threshold;

decreasing the annealing electrical current when a real-time voltage is greater than a preset voltage threshold; and decreasing the annealing electrical current when a real-time temperature is greater than a preset temperature threshold.

In an embodiment, the photovoltaic ribbon 3 is consisted of a copper substrate and a solder coating layer. During the copper substrate as a main body is pulled and stretched in a cold deformation process, the copper substrate exists accumulated internal stress, increased dislocations, and increased yield strength and hardness. When the copper substrate is subjected to a large current I≥80 A, a large amount of heat is generated due to thermal effect of a resistance of the copper substrate, which makes a temperature of the copper substrate rise rapidly to about 650° C. In this way, fine grains grow in the copper, deformation and hardening may be eliminated, so as to recover plasticity and deformation capability of the coper material and perform restoration and recrystallization to achieve the purpose of reducing the yield strength. In an embodiment, during a process of taking the ribbon 3 from the ribbon reel 7 to the ribbon 3 capable of soldering, processing is performed section by section on the stringer. The annealing process of the ribbon 3 is performed after the ribbon 3 is cut. The ribbon 3 is electrified by supplying power to the first electrode and the second electrode. Under the action of the large electrical current, the annealing process of the ribbon 3 may be completed within a very short time, and moving of the ribbon 3 is performed subsequently.

The method for manufacturing the photovoltaic ribbon in the present disclosure solves the problem of increased yield strength of the ribbon 3, by supplying a large current to the ribbon 3. The ribbon 3 is annealed after the ribbon 3 is pulled, stretched and cut. In this method, annealing process parameters on the ribbon 3 may be set more accurately, which may consider more sufficiently an effect of a stretch on the yield strength of the ribbon 3, and may further increase effectiveness of the annealing process, thereby increasing connection firmness between the ribbon 3 and the cell 12, and reducing the defect rate.

The photovoltaic stringer and the method for manufacturing the photovoltaic ribbon in the present disclosure are described in detail in the above. In the present text, specific examples are applied to describe the principle and implementation of the present disclosure. The above embodiments are only to help understanding the method and basic idea of the present disclosure. It shall be indicated that for those of ordinary skill in the existing technology, the present disclosure may be improved and amended without departing from the principle of the present disclosure. The improvement and amendment also fall within the protection scope of the claims of the present disclosure.

What is claimed is:

1. A method for manufacturing a photovoltaic ribbon, implemented by a photovoltaic stringer, comprising:
   acquiring a ribbon reel;
   pulling a ribbon;
   stretching the ribbon;
   cutting the ribbon to obtain a cut ribbon; and,
   performing an annealing process on the cut ribbon;
   wherein the photovoltaic stringer comprises:
   a first clamping component that pulls the ribbon from the ribbon reel;
   a second clamping component that coordinates with the first clamping component to stretch the ribbon;
   a cutting component that cuts the ribbon to obtain the cut ribbon;
   a holding component configured to install the cutting component and to fix an end of the ribbon; and
   at least one first electrode and at least one second electrode, wherein performing the annealing process includes supplying power to the cut ribbon using the at least one first electrode and the at least one second electrode, the at least one first electrode being installed on the first clamping component, the at least one second electrode being installed on the holding component.

2. The method according to claim 1, further comprising:
   moving, by the first clamping component and the second clamping component, the ribbon after the annealing process, for soldering a cell of a photovoltaic module.

3. The method according to claim 1, wherein the annealing process includes supplying an annealing current to the ribbon, supplying an annealing current to the ribbon comprising:
   supplying a direct current to the ribbon with the at least one first electrode and the at least one second electrode.

4. The method according to claim 1, wherein the annealing process includes converting an alternating current to a direct current by a rectifier; and
   supplying the direct current to the ribbon with the at least one first electrode and the at least one second electrode.

5. The method according to claim 3, wherein the direct current is greater than or equal to 10 A.

6. The method according to claim 4, wherein the direct current is greater than or equal to 10 A.

7. The method according to claim 1, wherein a cross section of the ribbon pulled is circular with a diameter of 0.3 mm to 0.4 mm, and a length of the cut ribbon is 50 mm to 220 mm.

8. The method according to claim 1, wherein the annealing process comprises:
   fixing, by the first clamping component and the holding component, two ends of the cut ribbon, respectively;
   connecting the two ends of the ribbon in an annealing circuit included in the photovoltaic stringer by coupling the at least one first electrode and the at least one second electrode to the two ends of the ribbon respectively;
   powering on the annealing circuit;
   powering off the annealing circuit after a preset electrified time; and,
   cooling the ribbon.

9. The method according to claim 8, wherein the annealing process further comprises:
   acquiring, by a monitoring component included in the annealing circuit, a real-time current and/or a real-time voltage, a real-time temperature and an electrified time of the cut ribbon after powering on the annealing circuit; and,
   adjusting, by a controller included in the annealing circuit, magnitude of an annealing electrical current input to the cut ribbon according to the real-time current and/or the real-time voltage, the real-time temperature and the electrified time acquired by the monitoring component.

10. A photovoltaic stringer, comprising:
    a first clamping component configured to pull a ribbon from a ribbon reel;
    a second clamping component configured to coordinate with the first clamping component to stretch the ribbon;
    a cutting component configured to cut the ribbon to obtain a cut ribbon;
    a holding component configured to install the cutting component and fixing an end of the ribbon; and
    at least one first electrode and at least one second electrode configured to supply power to the cut ribbon in an annealing process performed on the ribbon;
    wherein the at least one second electrode is installed on the holding component, and the at least one first electrode is installed on the first clamping component.

11. The photovoltaic stringer according to claim 10, wherein the at least one first electrode includes a plurality of first electrodes and the at least one second electrode includes a plurality of second electrodes;
    wherein the plurality of first electrodes are disposed on the first clamping component successively in a direction perpendicular to a pulling direction of the ribbon, and,
    the plurality of second electrodes are disposed on the holding component successively in the direction perpendicular to the pulling direction of the ribbon.

12. The photovoltaic stringer according to claim 11, wherein
    the first clamping component comprises:
    a first upper clamping section configured to hold downward the ribbon from above the ribbon, and,
    a first lower clamping section located below the first upper clamping section, the plurality of first electrodes respectively being disposed on the first upper clamping section; and,
    the holding component comprises:
    a second upper clamping section configured to hold downward the ribbon from above the ribbon, and,
    a second lower clamping section located below the second upper clamping section, the plurality of second electrodes respectively being disposed on the second upper clamping section.

13. The photovoltaic stringer according to claim 12, wherein
- the first lower clamping section is disposed with a plurality of first auxiliary electrodes in a one-to-one correspondence to the plurality of first electrodes,
- the second lower clamping section is disposed with a plurality of second auxiliary electrodes in a one-to-one correspondence to the plurality of second electrodes;
- wherein the first lower clamping section and the second lower clamping section are both made of a conductive material.

14. The photovoltaic stringer according to claim 10, further comprising:
- a monitoring component configured to acquire a real-time parameter of the ribbon, and,
- a controller configured to control a magnitude of an annealing electrical current input to the ribbon according to information acquired by the monitoring component;
- wherein the at least one first electrode, the at least one second electrode, the controller and the monitoring component are connected in an annealing circuit.

15. The photovoltaic stringer according to claim 14, further comprising:
- a transformer configured to adjust voltage, the transformer being electrically connected to the ribbon and the controller; and,
- a rectifier configured to convert an alternating current to a direct current.

16. The photovoltaic stringer according to claim 10, wherein the first clamping component is a clamping cylinder, and the second clamping component is a clamp.

* * * * *